United States Patent
Kim et al.

(10) Patent No.: US 10,331,346 B2
(45) Date of Patent: Jun. 25, 2019

(54) MEMORY SYSTEM USING BURST COMMAND FOR HANDLING PLURAL COMMANDS AND OPERATING METHOD THEREOF

(71) Applicant: SK hynix Inc., Gyeonggi-do (KR)

(72) Inventors: Ki-Sung Kim, Gyeonggi-do (KR); Young-Kyun Shin, Gyeonggi-do (KR); Keun-Hyung Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 178 days.

(21) Appl. No.: 15/407,315

(22) Filed: Jan. 17, 2017

(65) Prior Publication Data
US 2017/0344263 A1  Nov. 30, 2017

(30) Foreign Application Priority Data

May 31, 2016  (KR) .................. 10-2016-0067514

(51) Int. Cl.
*G06F 3/06* (2006.01)
*G11C 8/18* (2006.01)

(52) U.S. Cl.
CPC .......... *G06F 3/0604* (2013.01); *G06F 3/0659* (2013.01); *G06F 3/0679* (2013.01); *G11C 8/18* (2013.01)

(58) Field of Classification Search
CPC ..... G06F 3/0604; G06F 3/0659; G06F 3/0679
See application file for complete search history.

(56) References Cited

U.S. PATENT DOCUMENTS

| 7,870,351 | B2 | 1/2011 | Resnick |
| 8,131,889 | B2 | 3/2012 | Lee et al. |
| 8,954,644 | B2 | 2/2015 | Lee |
| 2004/0202028 | A1* | 10/2004 | Cioaca ................. G11C 7/103 365/189.11 |
| 2016/0162353 | A1* | 6/2016 | Manohar ............. H03M 13/27 714/760 |

FOREIGN PATENT DOCUMENTS

KR        101490327       2/2015

OTHER PUBLICATIONS

JEDEC, Universal Flash Storage (UFS) Unified Memory Extension, Mar. 2016, JESD220-1A (Year: 2016).*

* cited by examiner

*Primary Examiner* — Reginald G Bragdon
*Assistant Examiner* — Edward Wang
(74) *Attorney, Agent, or Firm* — IP & T Group LLP

(57) ABSTRACT

A memory system includes: a memory device comprising a plurality of dies each die comprising a plurality of planes, each plane comprising a plurality of blocks, each block comprising a plurality of pages; a controller suitable for inputting a plurality of commands received from a host to the memory device through command queuing, wherein a first memory die among the plurality of memory dies processes the plurality of commands as a burst command, and performs command operations in one or more pages in one or more first memory blocks included in the first memory die, and data corresponding to the command operations are stored in a plurality of latches corresponding to the one or more first memory blocks.

20 Claims, 9 Drawing Sheets

MEMORY SYSTEM USING BURST COMMAND FOR HANDLING PLURAL COMMANDS AND OPERATING METHOD THEREOF

CROSS-REFERENCE TO RELATED APPLICATIONS

The present application claims priority under 35 U.S.C. § 119(a) to Korean Patent Application No. 10-2016-0067514, filed on May 31, 2016 in the Korean Intellectual Property Office (KIPO), the disclosure of which is incorporated herein by reference in its entirety.

BACKGROUND

1. Field

Exemplary embodiments of the present invention relate to a memory system which processes data to a memory device and an operating method thereof.

2. Description of the Related Art

The computer environment paradigm has shifted to ubiquitous computing systems that can be used anytime and anywhere. Due to this, use of portable electronic devices such as mobile phones, digital cameras, and notebook computers has rapidly increased. These portable electronic devices generally use a memory system having one or more memory devices as a data storage device. The memory system may be used as a main memory or an auxiliary memory of the portable electronic devices.

Memory systems using memory devices provide excellent stability, durability, high information access speed, and low power consumption, since they have no moving parts. Examples of memory systems having such advantages include universal serial bus (USB) memory devices, memory cards having various interfaces, and solid state drives (SSD).

SUMMARY

Various embodiments are directed to a memory system capable of minimizing the complexity and performance degradation of the memory system and maximizing the utilization efficiency of a memory device, thereby rapidly and stably processing data to the memory device, and an operating method thereof.

In an embodiment, a memory system may include: a memory device comprising a plurality of dies each die comprising a plurality of planes, each plane comprising a plurality of blocks, each block comprising a plurality of pages; a controller suitable for inputting a plurality of commands received from a host to the memory device through command queuing, wherein a first memory die among the plurality of memory dies processes the plurality of commands as a burst command, and performs command operations in one or more pages in one or more first memory blocks included in the first memory die, and data corresponding to the command operations are stored in a plurality of latches corresponding to the one or more first memory blocks.

When the commands are a plurality of read commands or write commands, the first memory die may process the read commands or write commands inputted through the command queuing as the burst command, and may perform read operations or program operations corresponding to the read commands or write commands in the first memory blocks.

The first memory die may distribute and may store data corresponding to the read operations or program operations into the latches, and the data stored in the latches may be transmitted to the controller and provided to the host or programmed and stored into the one or more pages of the one or more first memory blocks.

The first memory die may store first data corresponding to a first read operation of the read operations in a first latch of the latches, and may store second data corresponding to a second read operation of the read operations in a second latch of the latches.

The first data stored in the first latch and the second data stored in the second latch may be transmitted to the controller at the same time, and then provided to the host through the controller.

The second data may be stored in the second latch from the one or more pages of the one or more first memory blocks through the second read operation, while the first data are transmitted to the controller.

The first memory die may store first data corresponding to a first program operation of the program operations in a first latch of the latches, and may store second data corresponding to a second program operation of the program operations in a second latch of the latches.

The first data stored in the first latch and the second data stored in the second latch may be programmed and stored into the one or more pages of the one or more first memory blocks at the same time.

The second data may be stored in the second latch from the controller while the first data stored in the first latch are programmed to the one or more pages of the one or more first memory blocks.

When set commands are further included in the commands, the first memory die may process the set commands and the read commands or write commands as the burst command, and may perform the read operations or program operations at parameters included in the set commands.

In an embodiment, an operating method of a memory system may include: receiving a plurality of commands from a host, for a plurality of pages included in each of a plurality of memory blocks of a memory device and including a plurality of memory cells coupled to a plurality of word lines; inputting the plurality of commands to the memory device through command queuing; and performing command operations in the memory blocks by processing the plurality of commands as a burst command. Data corresponding to the command operations may be stored in a plurality of latches corresponding to the memory blocks.

The performing of the command operations may include: processing a plurality of read commands or write commands inputted through the command queuing as the burst command, when the commands are the plurality of read commands or write commands; and performing read operations or program operations corresponding to the respective read commands or write commands in the memory blocks.

The performing of the command operations may further include distributing and storing data corresponding to the read operations or program operations into the latches, and the data stored in the latches may be transmitted to a controller and provided to the host or programmed and stored into the memory blocks.

The distributing and storing of the data may include: storing first data corresponding to a first read operation of the read operations in a first latch of the latches; and storing second data corresponding to a second read operation of the read operations in a second latch of the latches.

The first data stored in the first latch and the second data stored in the second latch may be transmitted to the controller of the memory device at the same time, and then provided to the host through the controller.

The second data may be stored in the second latch from the memory blocks through the second read operation, while the first data are transmitted to the controller of the memory device.

The distributing and storing of the data may include: storing first data corresponding to a first program operation of the program operations in a first latch of the latches, and storing second data corresponding to a second program operation of the program operations in a second latch of the latches.

The first data stored in the first latch and the second data stored in the second latch may be programmed and stored into the memory blocks at the same time.

The second data may be stored in the second latch from the controller of the memory device, while the first data stored in the first latch are programmed to the memory blocks.

The performing of the command operations may include: processing set commands and the read commands or write commands as the burst command when the set commands are further included in the commands, and performing the read operations or program operations at parameters included in the set commands.

BRIEF DESCRIPTION OF THE DRAWINGS

These and other features and advantages will become apparent to those skilled in the art to which the present invention pertains from the following detailed description of the present invention in reference to the accompanying drawings, wherein.

DETAILED DESCRIPTION

Figure 1:
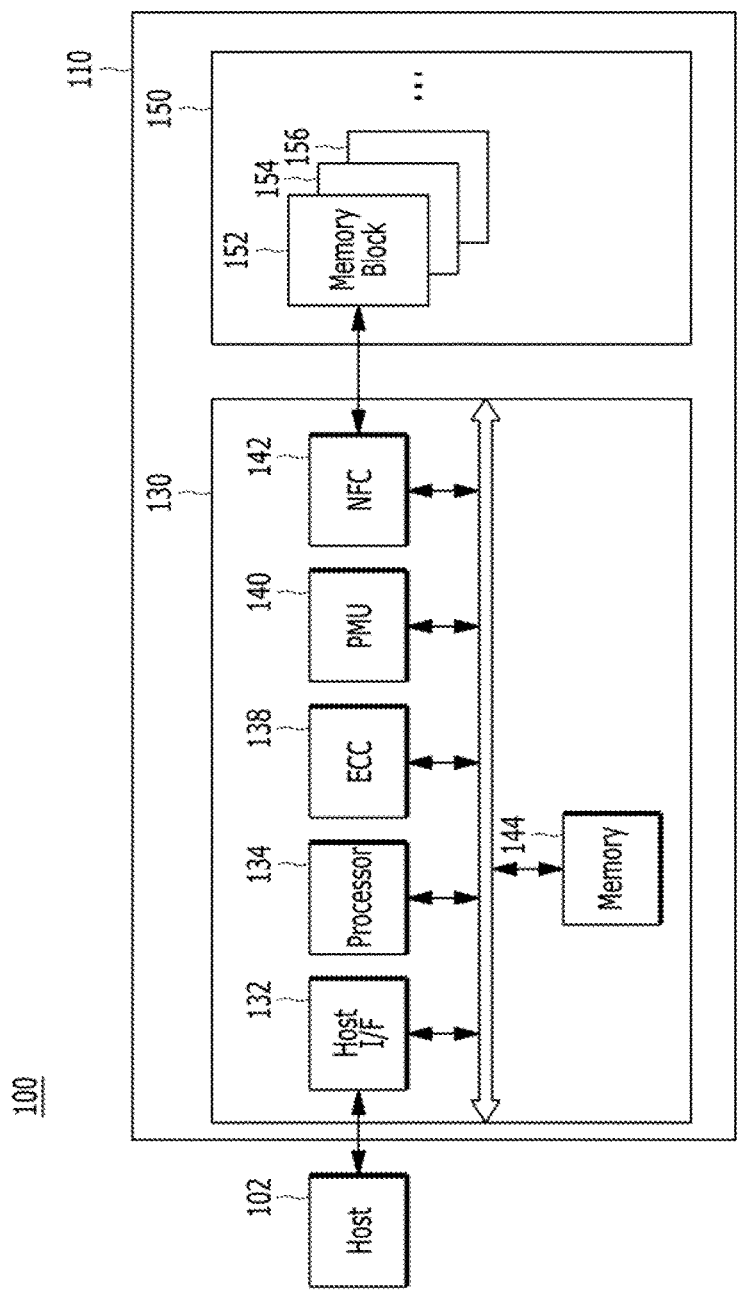
FIG. 1 is a diagram illustrating a data processing system including a memory system coupled to a host, according to an embodiment of the present invention.

Although, various embodiments are described below in more detail with reference to the accompanying drawings, we note that the present invention may, however, be embodied in different forms and should not be construed as being limited only to the embodiments set forth herein. Rather, the described embodiments are provided so that this disclosure will be thorough and complete, and will fully convey the present invention to those skilled in the art to which this invention pertains. Throughout the disclosure, like reference numerals refer to like parts throughout the various figures and embodiments of the present invention.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

The drawings are not necessarily to scale and, in some instances, proportions may have been exaggerated in order to clearly illustrate features of the embodiments.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "Including" when used in this specification, specify the presence of the stated elements and do not preclude the presence or addition of one or more other elements. As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

We further note that in the following description, numerous specific details are set forth in for providing a thorough understanding of the present invention. However, as would be apparent to those skilled in the relevant art, the present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, a feature or element described in connection with one embodiment may be used singly or in combination with other features or elements of another embodiment, unless otherwise specifically indicated.

Hereinafter, the various embodiments of the present invention will be described with reference to the attached drawings.

FIG. 1 illustrates a data processing system 100 including a memory system 110, according to an embodiment of the present invention.

Referring to FIG. 1, a data processing system 100 may include a host 102 operatively coupled to a memory system 110.

The host 102 may include, for example, a portable electronic device such as a mobile phone, an MP3 player and a laptop computer or a non-portable electronic device such as a desktop computer, a game player, a TV and a projector.

The memory system 110 may operate in response to a request received from the host 102. For example, the memory system 110 may store data to be accessed by the host 102. The memory system 110 may be used as a main memory system or an auxiliary memory system of the host 102. The memory system 110 may be implemented with any one of various storage devices, according to the protocol of a host interface to be coupled electrically with the host 102. The memory system 110 may be implemented with any one of various storage devices, such as, for example, a solid state drive (SSD), a multimedia card (MMC), an embedded MMC (eMMC), a reduced size MMC (RS-MMC), a micro-MMC, a secure digital (SD) card, a mini-SD, a micro-SD, a universal serial bus (USB) storage device, a universal flash storage (UFS) device, a compact flash (CF) card, a smart media (SM) card, a memory stick, and the like.

The storage devices for the memory system 110 may be implemented with a volatile memory device, such as, a dynamic random access memory (DRAM) and a static random access memory (SRAM) or a nonvolatile memory device such as a read only memory (ROM), a mask ROM (MROM), a programmable ROM (PROM), an erasable programmable ROM (EPROM), an electrically erasable programmable ROM (EEPROM), a ferroelectric random access memory (FRAM), a phase-change RAM (PRAM), a magnetoresistive RAM (MRAM), a resistive RAM (RRAM), and a flash memory.

The memory system 110 may include a memory device 150 for storing data to be accessed by the host 102, and a controller 130 operatively coupled to the memory device 150 for controlling the storage of data in the memory device 150 and the transfer of stored data from the memory device to the host.

The controller 130 and the memory device 150 may be integrated into a single semiconductor device. For instance, the controller 130 and the memory device 150 may be integrated into a single semiconductor device configured as a solid state drive (SSD). When the memory system 110 is used as the SSD, the operation speed of the host 102 that is electrically coupled with the memory system 110 may be significantly increased.

The controller 130 and the memory device 150 may be integrated into a single semiconductor device configured as a memory card, such as, for example, a Personal Computer Memory Card International Association (PCMCIA) card, a compact flash (CF) card, a smart media card (SMC), a memory stick, a multimedia card (MMC), an RS-MMC, a micro-MMC, a secure digital (SD) card, a mini-SD, a micro-SD, an SDHC, and a universal flash storage (UFS) device.

For another instance, the memory system 110 may be configured as part of a computer, an ultra-mobile PC (UMPC), a workstation, a net-book, a personal digital assistant (PDA), a portable computer, a web tablet, a tablet computer, a wireless phone, a mobile phone, a smart phone, an e-book, a portable multimedia player (PMP), a portable game player, a navigation device, a black box, a digital camera, a digital multimedia broadcasting (DMB) player, a three-dimensional (3D) television, a smart television, a digital audio recorder, a digital audio player, a digital picture recorder, a digital picture player, a digital video recorder, a digital video player, a storage configuring a data center, a device capable of transmitting and receiving information under a wireless environment, one of various electronic devices configuring a home network, one of various electronic devices configuring a computer network, one of various electronic devices configuring a telematics network, an RFID device, or one of various component elements configuring a computing system.

The memory device 150 of the memory system 110 may retain stored data when power supply to the device is interrupted and, in particular, store the data provided from the host 102 during a write operation, and provide stored data to the host 102 during a read operation. The memory device 150 may include a plurality of memory blocks, for example, memory blocks 152, 154 and 156. Each of the memory blocks 152, 154 and 156 may include a plurality of pages. Each of the pages may include a plurality of memory cells coupled to a word line (WL). The memory device 150 may be a nonvolatile memory device, for example, a flash memory. The flash memory may have a three-dimensional (3D) stack structure. The structure of the memory device 150 and the three-dimensional (3D) stack structure of the memory device 150 will be described later.

The controller 130 of the memory system 110 may control the memory device 150 in response to a request from the host 102. For example, upon receiving a read request from the host 102 the controller 130 may issue a read command and an address to the memory device for reading the data which are stored in the requested address in the memory device and may provide the data read from the memory device 150, to the host 102. Also, in response to a program request (also referred to as a write request) received from the host 102, the controller 130 may issue a write command, an address and write data and may control the operation of the memory device for storing the write data into the memory device 150. The write data are provided from the host 102 to the memory controller together with the write request. To this end, the controller 130 may control one or more operations of the memory device 150 including, for example, a read operation, a write operation and an erase operation. The controller 130 may also control one or more background operations of the memory device 150.

In the illustrated embodiment of FIG. 1, the controller 130 includes a host interface unit 132, a processor 134, an error correction code (ECC) unit 138, a power management unit (PMU) 140, a NAND flash controller (NFC) 142, and a memory 144.

The host interface unit 132 provides an interface between the host and the controller 130. For example, the host interface 132 may receive and process requests, addresses and data provided from the host 102. The host interface may also transmit read data from the memory device to the host.

The host interface 132 may communicate with the host 102 through at least one of various well-known interface protocols such as a universal serial bus (USB), a multimedia card (MMC), a peripheral component interconnect-express (PCI-E), a serial attached SCSI (SAS), a serial advanced technology attachment (SATA), a parallel advanced technology attachment (PATA), small computer system interface (SCSI), enhanced small disk interface (ESDI), and integrated drive electronics (IDE).

The ECC unit 138 may detect and correct errors in the data read from the memory device 150 during the read operation. The ECC unit 138 may not correct error bits when the number of the error bits is greater than or equal to a threshold number of correctable error bits, and may output an error correction fall signal indicating failure in correcting the error bits.

The ECC unit 138 may perform an error correction operation based on a coded modulation such as a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM), a Block coded modulation (BCM), and so on. The ECC unit 138 may include all circuits, systems or devices for the error correction operation.

The PMU 140 may provide and manage power for the controller 130, that is, power for the component elements included in the controller 130.

The NFC 142 may serve as a memory interface between the controller 130 and the memory device 150 to allow the controller 130 to control the memory device 150 in response to a request from the host 102. The NFC 142 may generate control signals for the memory device 150 and process data under the control of the processor 134 when the memory device 150 includes a flash memory and, in particular, when the memory device 150 includes a NAND flash memory.

The memory 144 may serve as a working memory of the memory system 110 and the controller 130, and store data for driving the memory system 110 and the controller 130. The controller 130 may control the memory device 150 in response to a request from the host 102. For example, the controller 130 may provide the data read from the memory device 150 to the host 102 and store the data provided from the host 102 in the memory device 150. When the controller 130 controls the operations of the memory device 150, the memory 144 may store data used by the controller 130 and the memory device 150 for such operations as read operation, write operation, program operation and erase operation.

The memory 144 may be implemented with volatile memory. The memory 144 may be implemented with a static random access memory (SRAM) or a dynamic random access memory (DRAM). As described above, the memory 144 may store data used by the host 102 and the memory device 150 for the read and write operations. To store the data, the memory 144 may include a program memory, a data memory, a write buffer, a read buffer, a map buffer, and so forth.

The processor 134 may control general operations of the memory system 110, and a write operation or a read operation for the memory device 150, in response to a write request or a read request from the host 102. The processor 134 may drive firmware, which is referred to as a flash translation layer (FTL), to control the general operations of the memory system 110. The processor 134 may be implemented with a microprocessor or a central processing unit (CPU).

A management unit (not shown) may be included in the processor 134, and may perform bad block management of the memory device 150. The management unit may find bad memory blocks included in the memory device 150, which are in unsatisfactory condition for further use, and perform bad block management on the bad memory blocks. When the memory device 150 is a flash memory, for example, a NAND flash memory, a program failure may occur during the write operation, for example, during the program operation, due to characteristics of a NAND logic function. During the bad block management, the data of the program-failed memory block or the bad memory block may be programmed into a new memory block. Also, the bad blocks due to the program fail seriously deteriorates the utilization efficiency of the memory device 150 having a 3D stack structure and the reliability of the memory system 100, and thus reliable bad block management is required.

Figure 2:
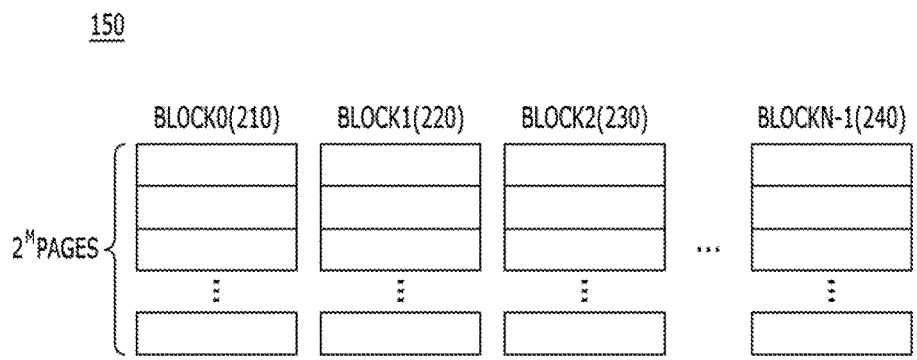
FIG. 2 is a diagram illustrating a configuration example of a memory device employed in the memory system of FIG. 1.

FIG. 2 is a schematic diagram illustrating the memory device 150 of FIG. 1.

Referring to FIG. 2, the memory device 150 may include a plurality of memory blocks, for example, zeroth to $(N-1)^{th}$ blocks 210 to 240. Each of the plurality of memory blocks 210 to 240 may include a plurality of pages, for example, $2^M$ number of pages ($2^M$ PAGES), to which the present invention will not be limited. Each of the plurality of pages may include a plurality of memory cells to which a plurality of word lines are electrically coupled.

Also, the memory device 150 may include a plurality of memory blocks, as single level cell (SLC) memory blocks and multi-level cell (MLC) memory blocks, according to the number of bits which may be stored or expressed in each memory cell. The SLC memory block may include a plurality of pages which are implemented with memory cells each capable of storing 1-bit data. The MLC memory block may include a plurality of pages which are implemented with memory cells each capable of storing multi-bit data, for example, two or more-bit data. The MLC memory block including a plurality of pages which are implemented with memory cells that are each capable of storing 3-bit data may be defined as a triple level cell (TLC) memory block.

Each of the plurality of memory blocks 210 to 240 may store the data provided from the host device 102 during a write operation, and may provide stored data to the host 102 during a read operation.

Figure 3:
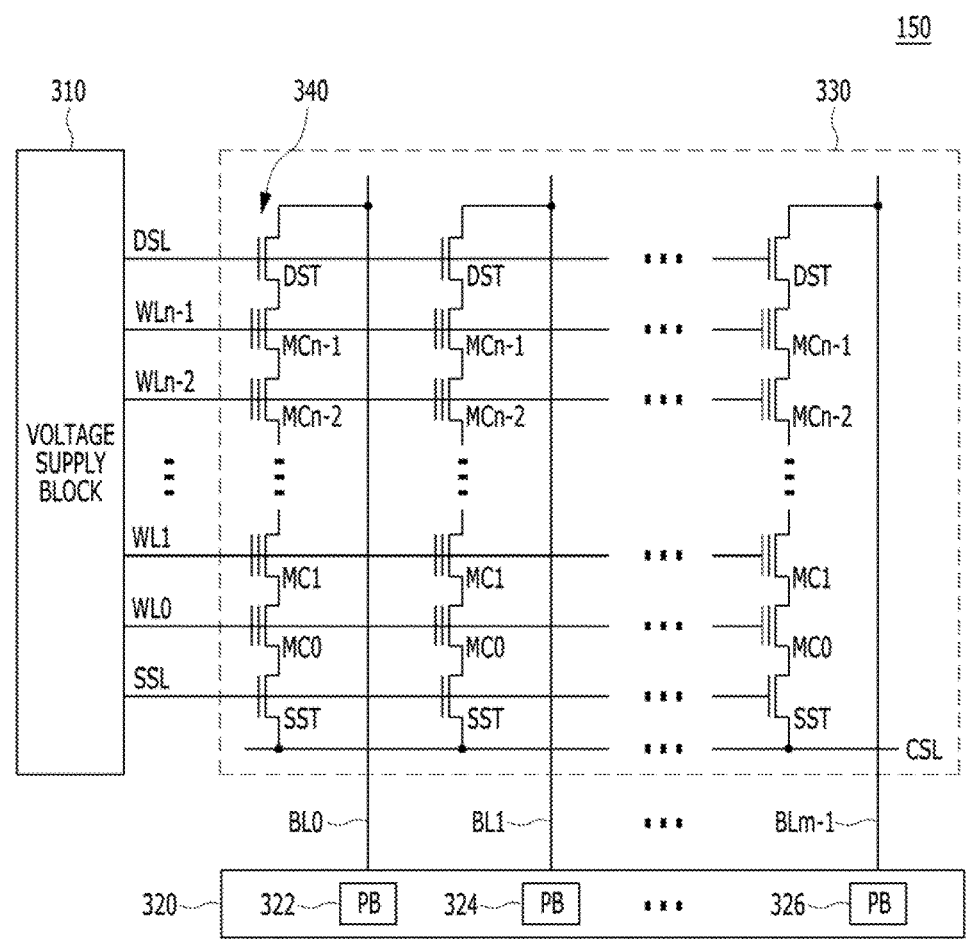
FIG. 3 is a diagram schematically illustrating a memory cell array circuit of a memory block in a memory device, according to an embodiment of the present invention.

FIG. 3 is a circuit diagram illustrating an example of a memory block in a memory device.

Referring to FIG. 3, a memory block 330 of a memory device 300 may include a plurality of cell strings 340 which are realized into a memory cell array and are coupled to bit lines BL0 to BLm−1, respectively. The cell string 340 of each column may include at least one drain select transistor DST and at least one source select transistor SST. A plurality of memory cells or memory cell transistors MC0 to MCn−1 may be coupled in series between the select transistors DST and SST. The respective memory cells MC0 to MCn−1 may be constructed by multi-level cells (MLC) each of which stores a data information of a plurality of bits. The cell strings 340 may be electrically coupled to corresponding bit lines BL0 to BLm−1, respectively. For reference, in FIG. 3, 'DSL' may denote a drain select line, 'SSL' may denote a source select line, and 'CSL' may denote a common source line.

While FIG. 3 shows, as an example, the memory block 330 which is constructed by NAND flash memory cells, it is to be noted that the memory block 330 of the memory device 300 according to the embodiment is not limited to a NAND flash memory and may be realized by a NOR flash memory, a hybrid flash memory in which at least two kinds of memory cells are combined or a one-NAND flash memory in which a controller is built in a memory chip. The operational characteristics of a semiconductor device may be applied to not only a flash memory device in which a charge storing layer is constructed by conductive floating gates but also a charge trap flash (CTF) in which a charge storing layer is constructed by a dielectric layer.

A voltage supply block 310 of the memory device 300 may provide word line voltages (for example, a program voltage, a read voltage and a pass voltage) to be supplied to respective word lines according to an operation mode and voltages to be supplied to bulks (for example, well regions) formed with memory cells. The voltage generating operation of the voltage supply block 310 may be performed by the control of a control circuit (not shown). The voltage supply block 310 may generate a plurality of variable read voltages to generate a plurality of read data, select one of the memory blocks (or sectors) of a memory cell array in response to the control of the control circuit, select one of the word lines of the selected memory block, and provide the word line voltages to the selected word line and unselected word lines.

A read/write circuit 320 of the memory device 300 is controlled by the control circuit, and may operate as a sense amplifier or a write driver according to an operation mode. For example, in the case of a verify/normal read operation, the read/write circuit 320 may operate as a sense amplifier for reading data from the memory cell array. Also, in the case of a program operation, the read/write circuit 320 may operate as a write driver which drives bit lines according to data to be stored in the memory cell array. In the program operation, the read/write circuit 320 may receive data to be written in the memory cell array, from a buffer (not shown), and may drive the bit lines according to inputted data. To this end, the read/write circuit 320 may include a plurality of page buffers (PB) 322, 324 and 326 respectively corresponding to columns (or bit lines) or pairs of columns (or pairs of bit lines), and a plurality of latches (not shown) may be included in each of the page buffers 322, 324 and 326.

Figure 4:
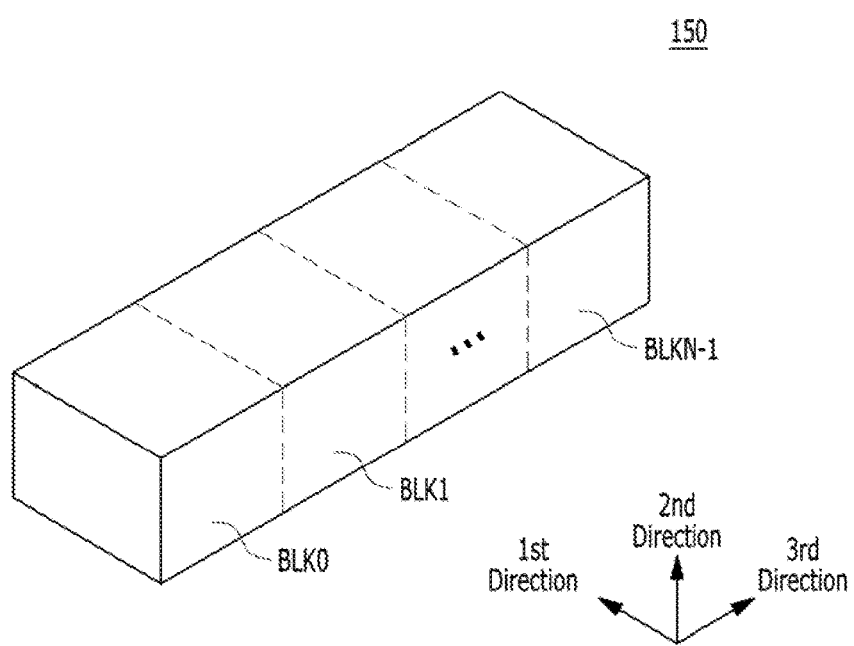
FIG. 4 is a diagram schematically illustrating a 3-D configuration of a memory device, according to an embodiment of the present invention.

Also, the memory device 150 may be realized as a 2-dimensional or 3-dimensional memory device. As shown in FIG. 4, in the case where the memory device 150 is realized as a 3-dimensional nonvolatile memory device, the memory device 150 may include a plurality of memory blocks BLK0 to BLKN−1.

FIG. 4 is a block diagram illustrating the memory blocks of the memory device shown in FIG. 2, and the memory blocks BLK0 to BLKN−1 may be realized as a 3-dimensional structure (or a vertical structure). For example, the respective memory blocks BLK0 to BLKN−1 may be realized as a 3-dimensional structure by including a structure which extends in first to third directions, for example, the x-axis direction, the y-axis direction and the z-axis direction.

The respective memory blocks BLK0 to BLKN−1 included in the memory device 150 may include a plurality of NAND strings which extend in the second direction. The plurality of NAND strings may be provided in the first direction and the third direction. Each NAND string may be coupled to a bit line, at least one string select line, at least one ground select line, a plurality of word lines, at least one dummy word line and a common source line, and may include a plurality of transistor structures.

Namely, among the plurality of memory blocks BLK0 to BLKN−1 of the memory device 150, the respective memory blocks BLK0 to BLKN−1 may be coupled to a plurality of bit lines, a plurality of string select lines, a plurality of ground select lines, a plurality of word lines, a plurality of dummy word lines and a plurality of common source lines, and accordingly, may include a plurality of NAND strings. Also, in the respective memory blocks BLK0 to BLKN−1, a plurality of NAND strings may be coupled to one bit line, and a plurality of transistors may be realized in one NAND string. A string select transistor of each NAND string may be coupled to a corresponding bit line, and a ground select transistor of each NAND string may be coupled to the common source line. Memory cells may be provided between the string select transistor and the ground select transistor of each NAND string. Namely, in the plurality of memory blocks BLK0 to BLKN−1 of the memory device 150, a plurality of memory cells may be realized in each of the memory blocks BLK0 to BLKN−1.

Hereafter, a data processing operation to a memory device in a memory system according to an embodiment of the present invention will be described in more detail with reference to FIGS. 5 and 6. More particularly a data processing operation to the memory device 150 through a command operation corresponding to a request received from the host 102 will be described in more detail with reference to FIGS. 5 and 6.

Figure 5:
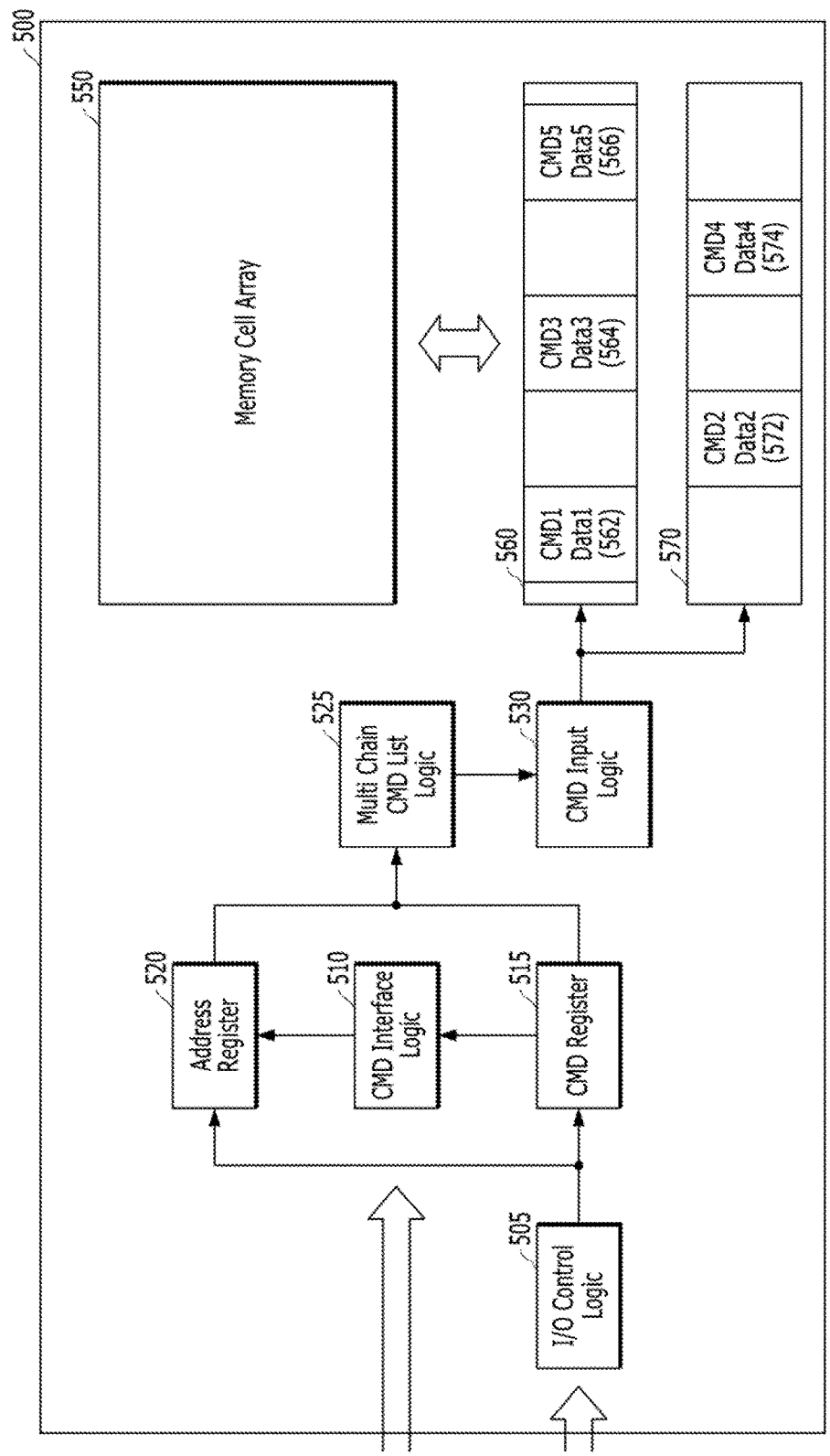
FIG. 5 is a diagram for schematically describing an example of a data processing operation to a memory device in a memory system, according to an embodiment of the present invention.

FIG. 5 is a diagram for schematically describing an example of a data processing operation to a memory device in a memory system according to an exemplary embodiment of the present invention. In an embodiment, the data processing operation may include a read operation wherein the memory system 110 of FIG. 1 reads data corresponding to a read request received from the host 102, for example, the memory system reads data corresponding to the read request from a memory location of one or more memory blocks included in the memory device 150 and provides the read data to the host 102. In another embodiment, the data processing operation may include programming write data corresponding to a write request received from the host to a memory location of one or more memory blocks included in the memory device 150.

In an embodiment, when the controller 130 of the memory system 110 receives a plurality of requests (also referred to as commands) from the host 102, for example, a plurality of read, write, erase and set requests (for example, set parameter commands and set feature commands) the controller 130 may input the plurality of requests to the memory device 150 through a command queuing method, and the memory device 150 may process the plurality of commands inputted from the controller 130, i.e., perform command operations corresponding to the plurality of received commands. For example, in response to a read command the controller 130 may provide data corresponding to the read command to the host 102, or in response to a write command, the controller 130 may store write data in one or more memory blocks included in the memory device 150. As described with reference to FIGS. 1 to 4, the memory device 150 may include a plurality of memory blocks, each of the memory blocks including a plurality of pages each of the pages having a plurality of memory cells coupled to a word line in for storing data therein. The memory device 150 may include a plurality of dies, each of the memory dies may include a plurality of planes, and each of the planes may include a plurality of memory blocks.

In an embodiment, a plurality of commands may be inputted to the memory device 150 from the controller 130, and one or more of the plurality of the memory dies included in the memory device 150 may process the plurality of commands. More particularly, a plurality of commands may be inputted to an arbitrary memory die among the plurality of memory dies included in the memory device 150 from the controller 130, the arbitrary memory die may then process the inputted commands as a burst command, and perform operations corresponding to the respective inputted commands in the memory blocks included in the memory die. The plurality of commands may include, for example, read commands, read commands with set commands, write commands or write commands with set commands. The arbitrary memory die may process the plurality of commands inputted from the controller 130 as a burst command meaning that the arbitrary memory die may successively process the plurality of commands, and successively perform the operations which correspond to the plurality of commands (also referred to hereinafter simply as "command operations"). For example, the arbitrary memory die may read data in response to a plurality of read command operations from a plurality of pages included in a plurality of memory blocks included in the memory die in a sequential manner, and provide the read data to the host. The arbitrary memory die may also program and store a plurality of write corresponding to a plurality of write commands into a plurality of pages in one or more memory blocks of the memory die.

In an embodiment, the data corresponding to the command operations which were performed in response to the burst command may be read from the memory cell array including the memory blocks or stored in the memory cell array through buffers implemented in the respective memory blocks included in the memory device 150 or particularly the respective memory dies included in the memory device 150, for example, the plurality of pages 322, 324 and 326, the plurality of caches or the plurality of registers which are included in the memory device 300 described with reference to FIG. 3. Hereafter, the data processing operation of the memory system according to the present embodiment will be described in more detail with reference to FIG. 5.

Referring to FIG. 5, a plurality of commands received from the host 102 may be inputted to the memory device 150 through command queuing of the controller 130, and an arbitrary first memory die 500 among the plurality of memory dies included in the memory device 150 may process the plurality of commands inputted from the controller 130 as a burst command to perform command operations corresponding to the plurality of inputted commands. For example, the arbitrary first memory die may read data corresponding to read command operations among the command operations from the memory cell array 550 forming the memory blocks of the first memory die 500, and provide the read data to the host 102. Also, the arbitrary first memory die may program and store write data corresponding to program command operations among the command operations into the memory cell array 550.

The first memory die 500 may include command interface logic 510, I/O control logic 505, a command register 515, an address register 520, multi chain command list logic 525, command input logic 530, a memory cell array 550, and a plurality of latches 560 and 570. The command interface logic 510 may receive a plurality of commands from the controller 130. The I/O control logic 505 may control data input/output with the controller 130. The command register 515 may store the plurality of commands inputted from the controller 130. The address register 520 may store addresses of the memory cell array 550, the addresses corresponding to the plurality of commands. The multi chain command list logic 525 may process the plurality of commands inputted from the controller 130 as a burst command. The command input logic 530 may input a command to the memory cell array 550, in order to perform a command operation on the memory cell array 550. The memory cell array 550 may perform a command operation corresponding to a command, and store or read data corresponding to the command operation. The plurality of latches 560 and 570 may transmit or receive the data corresponding to the command operation to or from the memory cell array 550, and include a latch 1(560) and a latch 2(570), for example. The first memory die 500 may include the plurality of latches corresponding to the memory cell array 550, that is, the latch 1(560) and the latch 2(570). When command operations corresponding to commands received from the host 102 are performed in the memory cell array 550, data corresponding to the command operations may be stored in the latch 1(560) and the latch 2(570).

The first memory die 500 may process a plurality of commands inputted from the controller 130 as a burst command through the multi chain command list logic 525 or successively process the plurality of commands to generate the burst command, and input the burst command to the memory cell array 550 through the command input logic 530. When the plurality of commands are inputted from the controller 130 through command queuing, the first memory die 500 may process the plurality of commands through the First In First Out (FIFO) method. Furthermore, when one command is inputted from the controller 130, the first memory die 500 may process the input command as a single command through the multi chain command list logic 525, and input a burst command to the memory cell array 550 through the command input logic 530. Hereafter, the case in which a plurality of commands, for example, a plurality of read commands and set commands or a plurality of write commands and set commands are inputted from the controller 130 through command queuing will be taken as an example for description.

First, when a plurality of commands, for example, five read commands and two set commands are inputted from the controller 130 through command queuing, the first memory die 500 may process the five read commands and two set commands as a burst command through the multi chain command list logic 525, and perform a read operation on the memory cell array 550 forming the memory blocks of the first memory die 500. The two set commands may include parameters when the read operation is performed, for example, a read level, a read voltage level and the like. When a set command 1, a read command 1, a read command 2, a read command 3, a set command 2, a read command 4 and a read command 5 are sequentially inputted from the controller 130 through command queuing, the first memory die 500 may input the two set commands and the five read commands as a burst command to the memory cell array 550.

Thus, at a read level 1 included in the set command 1, the first memory die 500 may read first data CMD1 Data1 (562) stored in a page 1 of the memory cell array 550 corresponding to the read command 1, and store the read data in the latch 1(560). Furthermore, the first memory die 500 may read second data CMD2 Data2 (572) stored in a page 2 of the memory cell array 550 corresponding to the read command 2, and store the read data in the latch 2(570). Moreover, the first memory die 500 may read third data CMD3 Data3 (564) stored in a page 3 of the memory cell array 550 corresponding to the read command 3, and store the read data in the latch 1(560). Then, the first memory die 500 may change the read level from the read level 1 to a read level 2 included in the set command 2, read fourth data CMD4 Data4 (574) stored in a page 4 of the memory cell array 550 corresponding to the read command 4, and store the read data in the latch 2(570). Furthermore, the first memory die 500 may read fifth data CMD5 Data5 (566) stored in a page 5 of the memory cell array 550 corresponding to the read command 5, and store the read data in the latch 1(560).

After storing the first data CMD1 Data1 (562) corresponding to the read command 1 in the latch 1(560), the first memory die 500 may transmit the first data CMD1 Data1 (562) stored in the latch 1(560) to a buffer outside the first memory die 500, for example, a buffer included in the controller 130, in order to provide the first data CMD1 Data1 (562) to the host 102. Furthermore, while the first data CMD1 Data1 (562) is transmitted to the buffer included in the controller 130, the first memory die 500 may read the second data CMD2 Data2 (572) stored in the page 2 of the memory cell array 550 corresponding to the read command 2, and store the read data in the latch 2(570). As described above, the first memory die 500 may read the data 562, 572, 564, 574 and 566 corresponding to the read commands from the memory cell array 550, store the read data in the latch 1(560) and the latch 2(570), and then transmit the data 562, 564 and 566 stored in the latch 1(560) and the data 572 and 574 stored in the latch 2(570) to the buffer included in the controller 130 at the same time, in order to provide the data to the host 102.

The first memory die 500 may distribute and store the data 562, 572, 564, 574 and 566 corresponding to the read commands into the latch 1(560) and the latch 2(570), thereby improving the utilization efficiency of the latches 560 and 570 included in the first memory die 500. In particular, the first memory die 500 may schedule the storage of the data 562, 572, 564, 574 and 566 corresponding to the read commands, according to the capacities of the latches 560 and 570 included in the first memory die 500. For example, the first memory die 500 may store the data 562, 572, 564, 574 and 566 corresponding to the read commands in only one latch, or store arbitrary sequential data in the latch 1(560) and store the other data in the latch 2(570). As described above, the first memory die 500 may alternately distribute and store the data 562, 572, 564, 574 and 566 corresponding to the read commands in the latch 1(560) and the latch 2(570), in consideration of the processing interval between the read operations corresponding to the read commands.

Next, when a plurality of write commands, for example, five write commands and two set commands are inputted from the controller 130 through command queuing, the first memory die 500 may process the five write commands and two set commands as a burst command through the multi chain command list logic 525, and perform a program operation on the memory cell array 550 forming the memory blocks of the first memory die 500. The two set commands may include parameters when the program operation is performed, for example, a program level, a program voltage level and the like. When a set command 1, a write command 1, a write command 2, a write command 3, a set command 2, a write command 4 and a write command 5 are sequentially inputted from the controller 130 through command queuing, the first memory die 500 may input the two set commands and five write commands as a burst command to the memory cell array 550.

Thus, at a program level 1 included in the set command 1, the first memory die 500 may store first data CMD1 Data1 (562) corresponding to the write command 1 in the latch 1(560), and then program and store the first data CMD1 Data1 (562) into the page 1 of the memory cell array 550. Furthermore, the first memory die 500 may store second data CMD2 Data1 (572) corresponding to the write command 2 in the latch 2(570), and then program and store the second data CMD2 Data1 (572) into the page 2 of the memory cell array 550. Moreover, the first memory die 500 may store third data CMD3 Data3 (564) corresponding to the write command 3 in the latch 1(560), and then program and store the third data CMD3 Data3 (564) into the page 3 of the memory cell array 550. The first memory die 500 may change the program level from the program level 1 to a program level 2 included in the set command 2. At the program level 2, the first memory die 500 may store fourth data CMD4 Data4 (574) corresponding to the write command 4 in the latch 2(570), and then program and store the fourth data CMD4 Data4 (574) into the page 4 of the memory cell array 550. Furthermore, the first memory die 500 may store fifth data CMD5 Data5 (566) corresponding to the write command 5 in the latch 1(560), and then program and store the fourth data CMD5 Data5 (566) into the page 5 of the memory cell array 550.

At this time, the first memory die 500 may receive the first data CMD1 Data1 (562) corresponding to the write command 1 from a buffer outside the first memory die 500, for example, a buffer included in the controller 130 and store the received data in the latch 1(560). Then, the first memory die 500 may program and store the first data CMD1 Data 1 (562) stored in the latch 1(560) into the page 1 of the memory cell array 550. Furthermore, while the first data CMD1 Data1 (562) is programmed and stored into the page 1 of the memory cell array 550, the first memory die 500 may receive the second data CMD2 Data2 (572) corresponding to the write command 2 from a buffer included in the controller 130, and store the received data in the latch 2(570). As described above, the first memory die 500 may receive the data 562, 572, 564, 574 and 566 corresponding to the write commands from the buffer included in the controller 130, store the received data in the latch 1(560) and the latch 2(570), and then program and store the data 562, 564 and 566 stored in the latch 1(560) and the data 572 and 574 stored in the latch 2(570) into the pages of the memory cell array 550 at the same time.

As the data 562, 572, 564, 574 and 566 corresponding to the write commands are distributed and stored into the latch 1(560) and the latch 2(570), the first memory die 500 can improve the utilization efficiency of the latches 560 and 570 included in the first memory die 500. In particular, the first memory die 500 may schedule the storage of the data 562, 572, 564, 574 and 566 corresponding to the write commands, according to the capacities of the latches 560 and 570 included in the first memory die 500. For example, the first memory die 500 may store the data 562, 572, 564, 574 and 566 corresponding to the write commands in only one latch, or store arbitrary sequential data in the latch 1(560) and store the other data in the latch 2(570). As described above, the first memory die 500 may alternately distribute and store the data 562, 572, 564, 574 and 566 corresponding to the write commands into the latch 1(560) and the latch 2(570), in consideration of the processing interval between the write operations corresponding to the write commands.

In an exemplary embodiment of the present invention, the controller 130 may receive a plurality of commands from the host 102. The plurality of commands may comprise a plurality of first commands including set commands and a plurality of second commands including read commands, write commands, erase commands, or combinations thereof. The controller 130 may transfer the plurality of commands to the multi chain command list logic 525 in the first memory die 500 through command queuing without a time delay. The multi chain command list logic 525 may process the plurality of commands as a burst command, and input the burst command to the memory cell array 550. The first memory die 500 may perform command operations corresponding to the plurality of commands as the burst command in the memory cell array 550.

Figure 6:
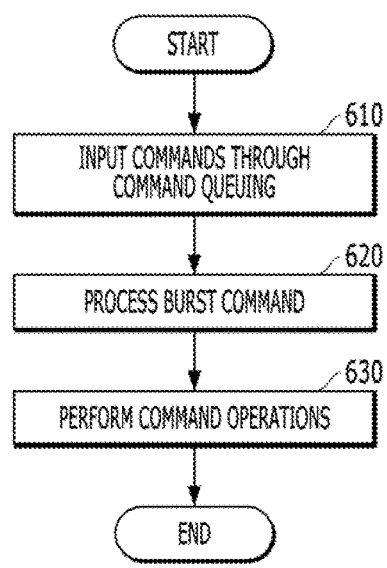
FIG. 6 is a flowchart of a data processing operation in a memory system, according to an embodiment of the present invention.

FIG. 6 is a flowchart schematically illustrating a data processing operation in a memory system according to an embodiment.

Referring to FIG. 6, at step 610, the memory system may input a plurality of commands received from the host 102 to the memory device 150 through command queuing.

At step 620, the memory system may process the plurality of commands inputted through command queuing as a burst command, and input the burst command to the memory cell array.

At step 630, the memory system may perform command operations corresponding to the plurality of commands in the memory cell array. For example, the memory system may store data corresponding to the command operations in the plurality of latches corresponding to the memory cell array, and then program and store the data into the memory cell array or read the data from the memory cell array and provide the read data to the host 102.

The configuration in which the memory system processes the plurality of commands as the burst command, performs command operations according to the input of the burst command, and stores and processes the data corresponding to the command operations into the plurality of latches has been described in detail with reference to FIG. 5. Thus, the detailed descriptions thereof are omitted herein. Hereafter, a data processing system and electronic devices to which the memory system 110 including the memory device 150 and the controller 130 and described with reference to FIGS. 1 to 6 according to the present embodiment is applied will be described in more detail with reference to FIGS. 7 to 12.

Figure 7:
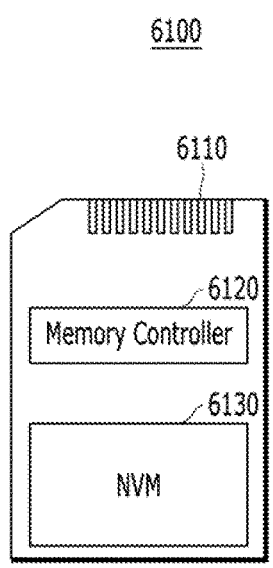
FIG. 7 is a diagram illustrating a memory card system, according to an embodiment of the present invention.

FIG. 7 is a diagram illustrating a data processing system including the memory system according to the embodiment. FIG. 7 is a diagram illustrating a memory card system, according to an embodiment of the present invention.

Referring to FIG. 7, a memory card system 6100 includes a memory controller 6120, a memory device 6130, and a connector 6110.

In detail, the memory controller 6120 may be connected with the memory device 6130 and may access the memory device 6130. In some embodiments, the memory device 6130 may be implemented with a nonvolatile memory (NVM). For example, the memory controller 6120 may control read, write, erase and background operations for the memory device 6130. The memory controller 6120 may provide an interface between the memory device 6130 and a host (not shown), and may drive a firmware for controlling the memory device 6130. For example, the memory controller 6120 may correspond to the controller 130 in the memory system 110 described above with reference to FIG. 1, and the memory device 6130 may correspond to the memory device 150 in the memory system 110 described above with reference to FIG. 1.

Therefore, the memory controller 6120 may include components such as a random access memory (RAM), a processing unit, a host interface, a memory interface and an error correction unit as shown in FIG. 1.

The memory controller 6120 may communicate with an external device (for example, the host 102 described above with reference to FIG. 1), through the connector 6110. For example, as described above with reference to FIG. 1, the memory controller 6120 may be configured to communicate with the external device through at least one of various communication protocols such as universal serial bus (USB), multimedia card (MMC), embedded MMC (eMMC), peripheral component interconnection (PCI), PCI express (PCIe), Advanced Technology Attachment (ATA), Serial-ATA, Parallel-ATA, small computer system interface (SCSI), enhanced small disk interface (ESDI), Integrated Drive Electronics (IDE), Firewire, universal flash storage (UFS), wireless-fidelity (WI-FI) and Bluetooth. Accordingly, the memory system and the data processing system according to the embodiment may be applied to wired/wireless electronic appliances, For example, a mobile electronic appliance.

The memory device 6130 may be implemented with a nonvolatile memory. For example, the memory device 6130 may be implemented with various nonvolatile memory devices such as an electrically erasable and programmable ROM (EPROM), a NAND flash memory, a NOR flash memory, a phase-change RAM (PRAM), a resistive RAM (ReRAM), a ferroelectric RAM (FRAM) and a spin torque transfer magnetic RAM (STT-MRAM).

The memory controller 6120 and the memory device 6130 may be integrated into a single semiconductor device. For example, the memory controller 6120 and the memory device 6130 may construct a solid state driver (SSD) by being integrated into a single semiconductor device. The memory controller 6120 and the memory device 6130 may construct a memory card such as a PC card (PCMCIA: Personal Computer Memory Card International Association), a compact flash card (CF), a smart media card (SM and SMC), a memory stick, a multimedia card (MMC, RS-MMC, MMCmicro and eMMC), an SD card (e.g., SD, miniSD, microSD and SDHC) and a universal flash storage (UFS).

Figure 8:
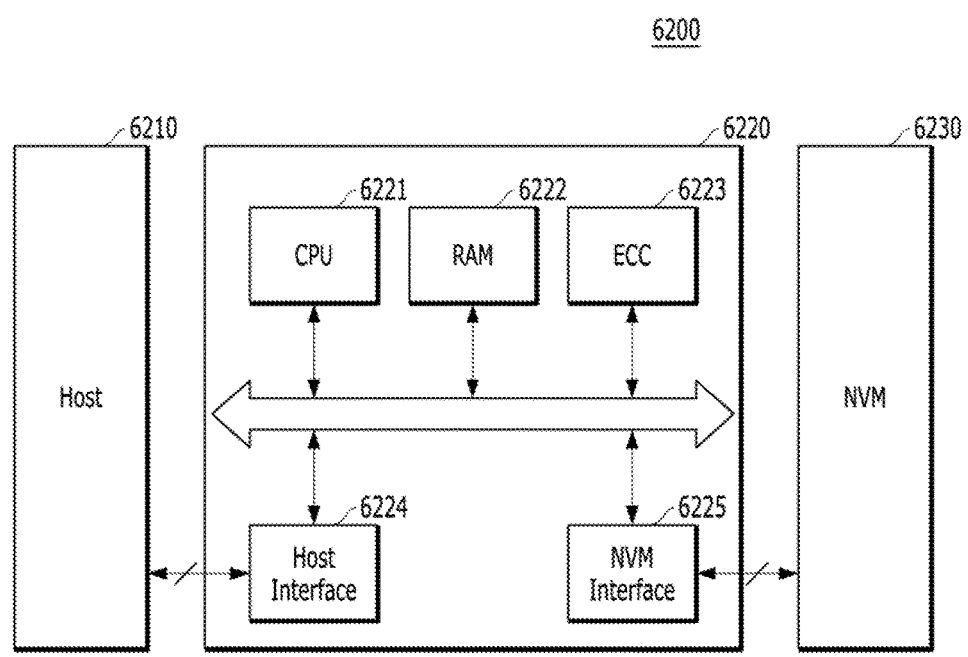
FIG. 8 is a block diagram illustrating a data processing system, according to an embodiment of the present invention.

FIG. 8 is a block diagram illustrating a data processing system, according to an embodiment of the present invention.

Referring to FIG. 8, a data processing system 6200 includes a memory device 6230 which may be implemented with at least one nonvolatile memory (NVM) and a memory controller 6220 for controlling the memory device 6230. The data processing system 6200 may be a storage medium such as a memory card (e.g., CF, SD and microSD), as described above with reference to FIG. 1. The memory device 6230 may correspond to the memory device 150 in the memory system 110 described above with reference to FIG. 1, and the memory controller 6220 may correspond to the controller 130 in the memory system 110 described above with reference to FIG. 1.

The memory controller 6220 may control the operations, including the read, write and erase operations for the memory device 6230 in response to requests received from a host 6210. The memory controller 6220 may include a central processing unit (CPU) 6221, a random access memory (RAM) as a buffer memory 6222, an error correction code (ECC) circuit 6223, a host interface 6224, and an NVM interface as a memory interface 6225, all coupled via an internal bus.

The CPU 6221 may control the operations for the memory device 6230 such as read, write, file system management, bad page management, and so forth. The RAM 6222 may operate according to control of the CPU 6221, and may be used as a work memory, a buffer memory, a cache memory, or the like. In the case where the RAM 6222 is used as a work memory, data processed by the CPU 6221 is temporarily stored in the RAM 6222. In the case where the RAM 6222 is used as a buffer memory, the RAM 6222 is used to buffer data to be transmitted from the host 6210 to the memory device 6230 or from the memory device 6230 to the host 6210. In the case where the RAM 6222 is used as a cache memory, the RAM 6222 may be used to enable the memory device 6230 with a low speed to operate at a high speed.

The ECC circuit 6223 corresponds to the ECC unit 138 of the controller 130 described above with reference to FIG. 1. As described above with reference to FIG. 1, the ECC circuit 6223 may generate an error correction code (ECC) for correcting a fail bit or an error bit in the data received from the memory device 6230. The ECC circuit 6223 may perform error correction encoding for data to be provided to the memory device 6230, and may generate data added with parity bits. The parity bits may be stored in the memory device 6230. The ECC circuit 6223 may perform error correction decoding for data outputted from the memory device 6230. At this time, the ECC circuit 6223 may correct errors by using the parity bits. For example, as described above with reference to FIG. 1, the ECC circuit 6223 may correct errors by using various coded modulations such as of a low density parity check (LDPC) code, a Bose-Chaudhuri-Hocquenghem (BCH) code, a turbo code, a Reed-Solomon (RS) code, a convolution code, a recursive systematic code (RSC), a trellis-coded modulation (TCM) and a Block coded modulation (BCM).

The memory controller 6220 transmits and receives data to and from the host 6210 through the host interface 6224, and transmits and receives data to and from the memory device 6230 through the NVM interface 6225. The host interface 6224 may be connected with the host 6210 through at least one of various interface protocols such as a parallel advanced technology attachment (PATA) bus, a serial advanced technology attachment (SATA) bus, a small computer system interface (SCSI), a universal serial bus (USB), a peripheral component interconnection express (PCIe) or a NAND interface. Further, as a wireless communication function or a mobile communication protocol such as wireless fidelity (WI-FI) or long term evolution (LTE) is realized, the memory controller 6220 may transmit and receive data by being connected with an external device such as the host 6210 or another external device other than the host 6210. Specifically, as the memory controller 6220 is configured to communicate with an external device through at least one among various communication protocols, the memory system and the data processing system according to the embodiment may be applied to wired/wireless electronic appliances, For example, a mobile electronic appliance.

Figure 9:
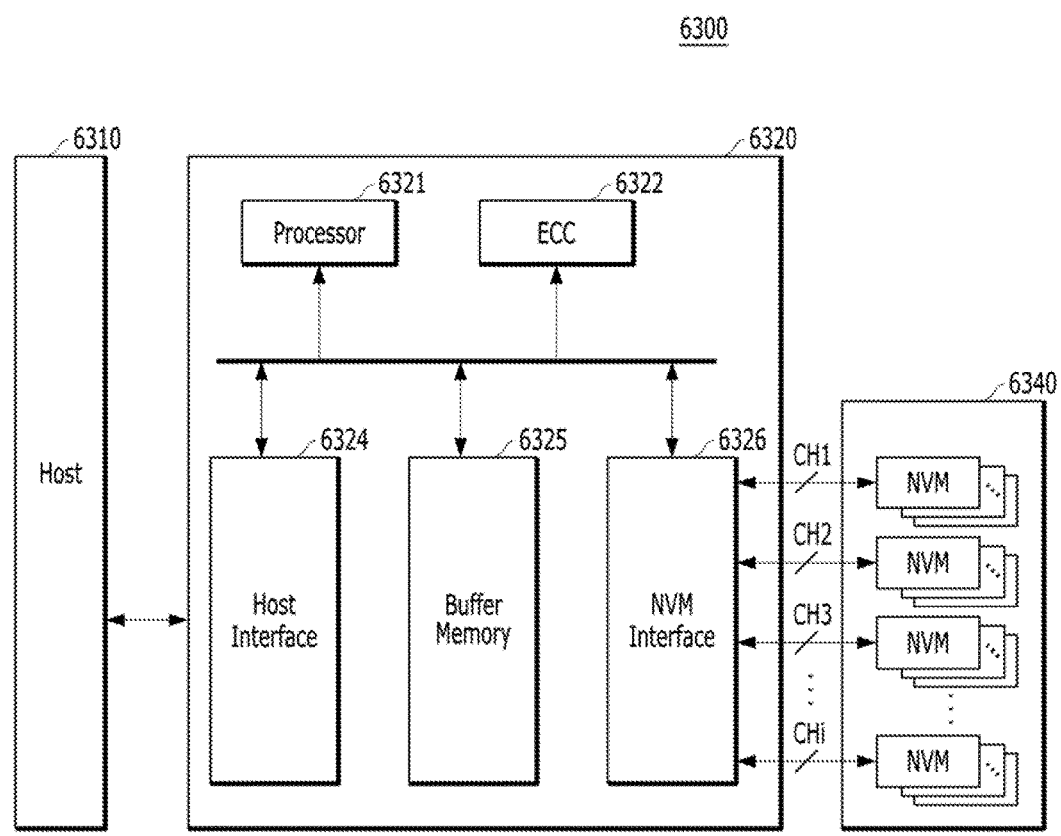
FIG. 9 is a block diagram illustrating a solid state drive, according to an embodiment of the present invention.

FIG. 9 is a block diagram illustrating a solid state drive (SSD), according to an embodiment of the present invention.

Referring to FIG. 9, an SSD 6300 may include a memory device 6340 which may include a plurality of nonvolatile memories NVM, and a controller 6320. The controller 6320 may correspond to the controller 130 in the memory system 110 described above with reference to FIG. 1, and the memory device 6340 may correspond to the memory device 150 in the memory system 110 described above with reference to FIG. 1.

In detail, the controller 6320 may be connected with the memory device 6340 through a plurality of channels CH1, CH2, CH3, . . . and CHi. The controller 6320 may include a processor 6321, a buffer memory 6325, an error correction code (ECC) circuit 6322, a host interface 6324, and a nonvolatile memory (NVM) interface as a memory interface 6326 coupled via an internal bus.

The buffer memory 6325 temporarily stores data received from a host 6310 or data received from a plurality of nonvolatile memories NVMs included in the memory device 6340, or temporarily stores metadata of the plurality of nonvolatile memories NVMs. For example, the metadata may include map data including mapping tables. The buffer memory 6325 may be implemented with a volatile memory such as, but not limited to, a dynamic random access memory (DRAM), a synchronous dynamic random access memory (SDRAM), a double data rate (DDR) SDRAM, a low power double data rate (LPDDR) SDRAM and a graphic random access memory (GRAM) or a nonvolatile memory such as, but not limited to, a ferroelectric random access memory (FRAM), a resistive random access memory (ReRAM), a spin-transfer torque magnetic random access memory (STT-MRAM) and a phase change random access memory (PRAM). While it is illustrated in FIG. 9, for the sake of convenience in explanation, that the buffer memory 6325 is disposed inside the controller 6320, it is to be noted that the buffer memory 6325 may be disposed outside the controller 6320.

The ECC circuit 6322 calculates error correction code values of data to be programmed in the memory device 6340 in a program operation, performs an error correction operation for data read from the memory device 6340, based on the error correction code values, in a read operation, and performs an error correction operation for data recovered from the memory device 6340 in a recovery operation for failed data.

The host interface 6324 provides an interface function with respect to an external device such as the host 6310. The nonvolatile memory interface 6326 provides an interface function with respect to the memory device 6340 which is connected through the plurality of channels CH1, CH2, CH3, . . . and CHi.

As a plurality of SSDs 6300 to each of which the memory system 110 described above with reference to FIG. 1 is applied are used, a data processing system such as a redundant array of independent disks (RAID) system may be implemented. In the RAID system, the plurality of SSDs 6300 and an RAID controller for controlling the plurality of SSDs 6300 may be included. In the case of performing a program operation by receiving a write command from the host 6310, the RAID controller may select at least one memory system (For example, at least one SSD 6300) in response to the RAID level information of the write command received from the host 6310, among a plurality of RAID levels (for example, the plurality of SSDs 6300) and may output data corresponding to the write command, to the selected SSD 6300. In the case of performing a read operation by receiving a read command from the host 6310, the RAID controller may select at least one memory system (For example, at least one SSD 6300) in response to the RAID level information of the write command received from the host 6310, among the plurality of RAID levels (for example, the plurality of SSDs 6300), and may provide data outputted from the selected SSD 6300, to the host 6310.

Figure 10:
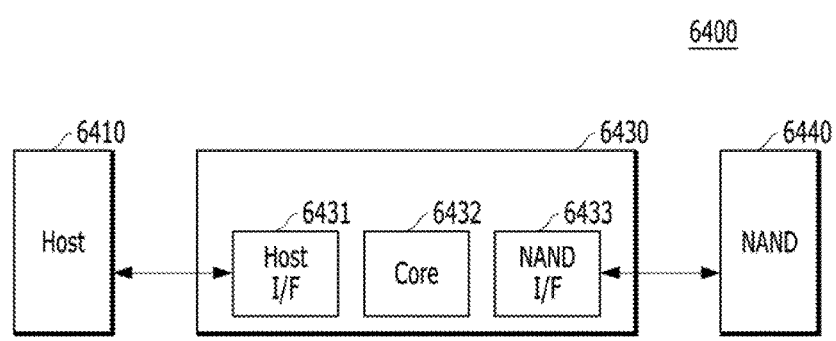
FIG. 10 is a block diagram schematically illustrating an embedded multimedia card (eMMC), according to an embodiment of the present invention.

FIG. 10 is a diagram illustrating another example of a data processing system including the memory system according to an embodiment of the present invention. FIG. 10 is a block diagram schematically illustrating an embedded multimedia card (eMMC), according to an embodiment of the present invention.

Referring to FIG. 10, an eMMC 6400 includes a memory device 6440 which is implemented with at least one NAND flash memory, and a controller 6430. The controller 6430 may correspond to the controller 130 in the memory system 110 described above with reference to FIG. 1, and the memory device 6440 may correspond to the memory device 150 in the memory system 110 described above with reference to FIG. 1.

In detail, the controller 6430 may be connected with the memory device 6440 through a plurality of channels. The controller 6430 may include a core 6432, a host interface 6431, and a memory interface such as a NAND interface 6433.

The core 6432 may control the operations of the eMMC 6400. The host interface 6431 may provide an interface function between the controller 6430 and a host 6410. The NAND interface 6433 may provide an interface function between the memory device 6440 and the controller 6430. For example, the host interface 6431 may be a parallel interface such as an MMC interface, as described above with reference to FIG. 1, or a serial interface such as an ultra-high speed class 1 (UHS-I)/UHS class 2 (UHS-II) and a universal flash storage (UFS) interface.

Figure 11:
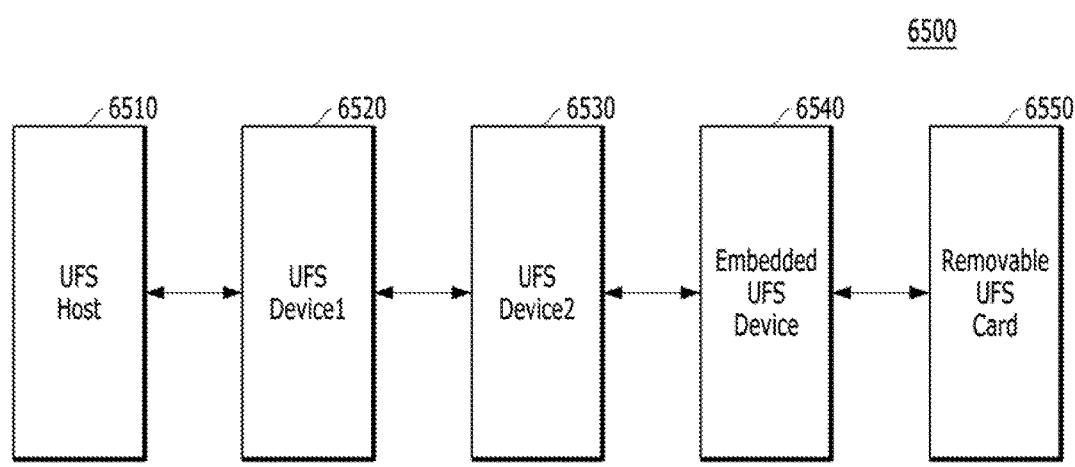
FIG. 11 is a block diagram illustrating a universal flash storage (UFS), according to an embodiment of the present invention.

FIG. 11 is a diagram illustrating another example of a data processing system including a memory system according to an embodiment of the present invention. FIG. 11 is a block diagram illustrating a universal flash storage (UFS), according to an embodiment of the present invention.

Referring to FIG. 11, a UFS system 6500 may include a UFS host 6510, a plurality of UFS devices 6520 and 6530, an embedded UFS device 6540, and a removable UFS card 6550. The UFS host 6510 may be an application processor of wired/wireless electronic appliances, for example, a mobile electronic appliance.

The UFS host 6510, the UFS devices 6520 and 6530, the embedded UFS device 6540 and the removable UFS card 6550 may respectively communicate with external devices such as wired/wireless electronic appliances (for example, a mobile electronic appliance), through a UFS protocol. The UFS devices 6520 and 6530, the embedded UFS device 6540 and the removable UFS card 6550 may be implemented with the memory system 110 described above with reference to FIG. 1, for example, as the memory card system 6100 described above with reference to FIG. 7. The embedded UFS device 6540 and the removable UFS card 6550 may communicate through another protocol other than the UFS protocol. For example, the embedded UFS device 6540 and the removable UFS card 6550 may communicate through various card protocols such as, but not limited to, USB flash drives (UFDs), multimedia card (MMC), secure digital (SD), mini SD and Micro SD.

Figure 12:
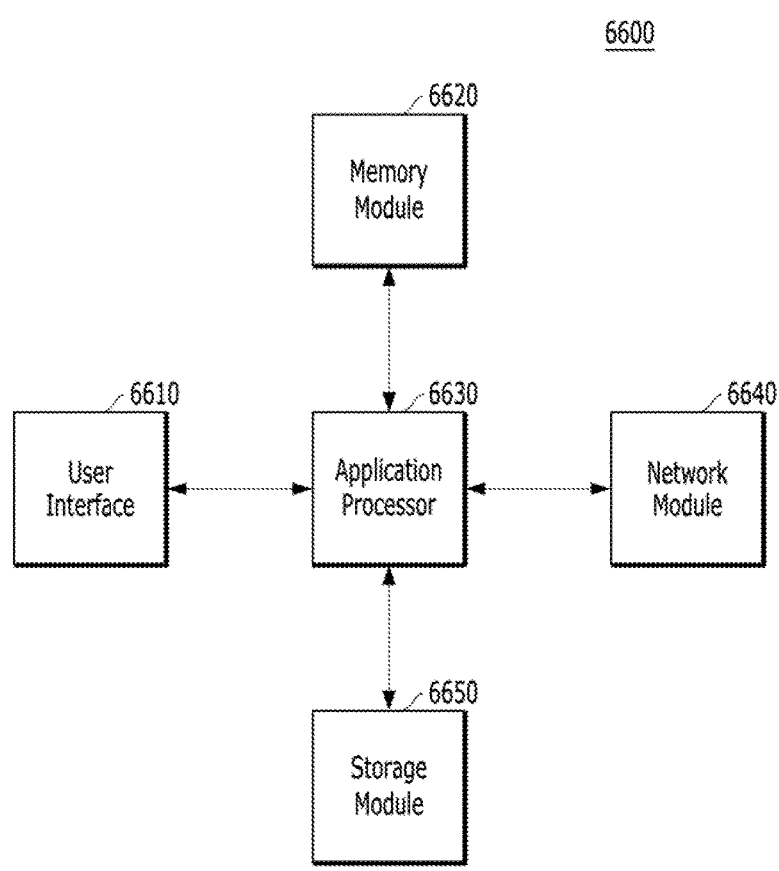
FIG. 12 is a block diagram schematically illustrating a user system including a memory system, according to an embodiment of the present invention.

FIG. 12 is a diagram illustrating an example of a data processing system including the memory system according to an embodiment of the present invention. FIG. 12 is a block diagram schematically illustrating a user system including a memory system, according to an embodiment of the present invention.

Referring to FIG. 12, a user system 6600 may include an application processor 6630, a memory module 6620, a network module 6640, a storage module 6650, and a user interface 6610.

The application processor 6630 may drive components included in the user system 6600 and an operating system (OS). For example, the application processor 6630 may include controllers for controlling the components included in the user system 6600, interfaces, graphics engines, and so on. The application processor 6630 may be provided by a system-on-chip (SoC).

The memory module 6620 may operate as a main memory, a working memory, a buffer memory or a cache memory of the user system 6600. The memory module 6620 may include a volatile random access memory such as a dynamic random access memory (DRAM), a synchronous dynamic random access memory (SDRAM), a double data rate (DDR) SDRAM, a DDR2 SDRAM, a DDR3 SDRAM, a low power double data rate (LPDDR) SDRAM, an LPDDR2 SDRAM and an LPDDR3 SDRAM or a nonvolatile random access memory such as a phase change random access memory (PRAM), a resistive random access memory (ReRAM), a magnetic random access memory (MRAM) and a ferroelectric random access memory (FRAM). For example, the application processor 6630 and the memory module 6620 may be mounted by being packaged on the basis of a package-on-package (POP).

The network module 6640 may communicate with external devices. For example, the network module 6640 may support not only wired communications but also various wireless communications such as code division multiple access (CDMA), global system for mobile communication (GSM), wideband CDMA (WCDMA), CDMA-2000, time division multiple access (TDMA), long term evolution (LTE), worldwide interoperability for microwave access (WiMAX), wireless local area network (WLAN), ultra-wideband (UWB), Bluetooth, wireless display (WI-DI), and so on, and may thereby communicate with wired/wireless electronic appliances, For example, a mobile electronic appliance. According to this fact, the memory system and the data processing system according to the embodiment may be applied to wired/wireless electronic appliances. The network module 6640 may be included in the application processor 6630.

The storage module 6650 may store data such as data received from the application processor 6530, and transmit data stored therein, to the application processor 6530. The storage module 6650 may be realized by a nonvolatile semiconductor memory device such as a phase-change RAM (PRAM), a magnetic RAM (MRAM), a resistive RAM (ReRAM), a NAND flash memory, a NOR flash memory and a 3-dimensional NAND flash memory. The storage module 6650 may be provided as a removable storage medium such as a memory card of the user system 6600 and an external drive. For example, the storage module 6650 may correspond to the memory system 110 described above with reference to FIG. 1, and may be implemented with the SSD, eMMC and UFS described above with reference to FIGS. 9 to 11.

The user interface 6610 may include interfaces for inputting data or commands to the application processor 6630 or for outputting data to an external device. For example, the user interface 6610 may include user input interfaces such as a keyboard, a keypad, a button, a touch panel, a touch screen, a touch pad, a touch ball, a camera, a microphone, a gyroscope sensor, a vibration sensor and a piezoelectric element, and user output interfaces such as a liquid crystal display (LCD), an organic light emitting diode (OLED) display device, an active matrix OLED (AMOLED) display device, a light emitting diode (LED), a speaker and a motor.

In the case where the memory system 110 described above with reference to FIG. 1 is applied to the mobile electronic appliance of the user system 6600 according to an embodiment, the application processor 6630 may control the operations of the mobile electronic appliance, and the network module 6640 as a communication module may control wired/wireless communication with an external device, as described above. The user interface 6610 as the display/touch module of the mobile electronic appliance displays data processed by the application processor 6630 or supports input of data from a touch panel.

According to the present embodiments, the memory system and the operating method thereof can minimize the complexity and performance degradation of the memory system and maximize the utilization efficiency of the memory device, thereby rapidly and stably processing data to the memory device.

Although various embodiments have been described for illustrative purposes, it will be apparent to those skilled in the art that various changes and modifications may be made without departing from the spirit and scope of the invention as defined in the following claims.

What is claimed is:

1. A memory system comprising:
   a memory device comprising a plurality of dies each die comprising a plurality of planes, each plane comprising a plurality of blocks, each block comprising a plurality of pages, wherein each memory die includes a plurality of latches;
   a controller configured to input a plurality of commands received from a host to the memory device through command queuing, the plurality of commands comprising a plurality of command operations,
   wherein the command operations on one or more pages in one or more first memory blocks included in a first memory die are sequentially performed as a burst command,
   data sequentially outputted or inputted in response to the command operations are alternately distributed and stored in the plurality of latches, and
   the data stored in the plurality of latches are either written in the one or more first memory blocks or outputted to the controller.

2. The memory system of claim 1, wherein when the commands are a plurality of read commands or write commands, the first memory die processes the read commands or write commands inputted through the command queuing as the burst command, and performs read operations or program operations corresponding to the read commands or write commands in the one or more pages of the one or more first memory blocks.

3. The memory system of claim 2, wherein
   the data stored in the latches are provided to the host or programmed and stored into the one or more pages of the one or more first memory blocks.

4. The memory system of claim 3, wherein the first memory die stores first data corresponding to a first read operation of the read operations in a first latch of the latches, and stores second data corresponding to a second read operation of the read operations in a second latch of the latches.

5. The memory system of claim 4, wherein the first data stored in the first latch and the second data stored in the second latch are transmitted to the controller at the same time, and then provided to the host through the controller.

6. The memory system of claim 4, wherein the second data are stored in the second latch from the one or more pages of the one or more first memory blocks through the second read operation, while the first data are transmitted to the controller.

7. The memory system of claim 3, wherein the first memory die stores first data corresponding to a first program operation of the program operations in a first latch of the latches, and stores second data corresponding to a second program operation of the program operations in a second latch of the latches.

8. The memory system of claim 7, wherein the first data stored in the first latch and the second data stored in the second latch are programmed and stored into the one or more pages of the one or more first memory blocks at the same time.

9. The memory system of claim 7, wherein the second data are stored in the second latch from the controller while the first data stored in the first latch are programmed to the one or more pages of the one or more first memory blocks.

10. The memory system of claim 2, wherein when set commands are further included in the commands, the first memory die processes the set commands and the read commands or write commands as the burst command, and performs the read operations or program operations at parameters included in the set commands.

11. An operating method of a memory system, comprising:
    receiving a plurality of commands from a host, for a memory device comprising a plurality of dies each die comprising a plurality of planes, each plane comprising a plurality of blocks, each block comprising a plurality of pages, wherein each memory die includes a plurality of latches;
    inputting the plurality of commands, comprising a plurality of command operations, to the memory device through command queuing;
    sequentially performing the command operations in the memory blocks by processing the plurality of commands as a burst command,
    alternately distributing and storing data, sequentially outputted or inputted in response to the command operations, in the plurality of latches, and
    at least one of writing the data stored in the plurality of latches in the one or more memory blocks and outputting the data stored in the plurality of latches to a controller.

12. The operating method of claim 11, wherein the performing of the command operations comprises:
    processing a plurality of read commands or write commands inputted through the command queuing as the burst command, when the commands are the plurality of read commands or write commands; and
    performing read operations or program operations corresponding to the respective read commands or write commands in the memory blocks.

13. The operating method of claim 12, wherein
    the data stored in the latches are provided to the host or programmed and stored into the memory blocks.

14. The operating method of claim 13, wherein the distributing and storing of the data comprises:
    storing first data corresponding to a first read operation of the read operations in a first latch of the latches; and
    storing second data corresponding to a second read operation of the read operations in a second latch of the latches.

15. The operating method of claim 14, wherein the first data stored in the first latch and the second data stored in the second latch are transmitted to the controller of the memory device at the same time, and then provided to the host through the controller.

16. The operating method of claim 14, wherein the second data are stored in the second latch from the memory blocks through the second read operation, while the first data are transmitted to the controller of the memory device.

17. The operating method of claim 13, wherein the distributing and storing of the data comprises:
    storing first data corresponding to a first program operation of the program operations in a first latch of the latches, and
    storing second data corresponding to a second program operation of the program operations in a second latch of the latches.

18. The operating method of claim 17, wherein the first data stored in the first latch and the second data stored in the second latch are programmed and stored into the memory blocks at the same time.

19. The operating method of claim 17, wherein the second data are stored in the second latch from the controller of the memory device, while the first data stored in the first latch are programmed to the memory blocks.

20. The operating method of claim 12, wherein the performing of the command operations comprises:
 processing set commands and the read commands or write commands as the burst command when the set commands are further included in the commands, and
 performing the read operations or program operations at parameters included in the set commands.

* * * * *